(12) United States Patent
Jeong et al.

(10) Patent No.: US 12,557,387 B2
(45) Date of Patent: Feb. 17, 2026

(54) DISPLAY DEVICE

(71) Applicant: LG Display Co., Ltd., Seoul (KR)

(72) Inventors: Yongmin Jeong, Seoul (KR); DaHye Shim, Seoul (KR); DongHo Choi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 603 days.

(21) Appl. No.: 18/056,214

(22) Filed: Nov. 16, 2022

(65) Prior Publication Data

US 2023/0215874 A1 Jul. 6, 2023

(30) Foreign Application Priority Data

Dec. 30, 2021 (KR) .......................... 10-2021-0192150

(51) Int. Cl.
*G09G 5/00* (2006.01)
*H10D 86/40* (2025.01)
*H10D 86/60* (2025.01)
*H10W 90/00* (2026.01)

(52) U.S. Cl.
CPC .......... *H10D 86/60* (2025.01); *H10D 86/441* (2025.01); *H10W 90/00* (2026.01); *H10W 90/732* (2026.01)

(58) Field of Classification Search
CPC .............. G09G 3/035; G09G 3/2696; G09G 2300/0426; G09F 9/301; G02F 1/133305; H01L 24/32; H10D 86/441; H10K 59/131
See application file for complete search history.

(56) References Cited

U.S. PATENT DOCUMENTS

| | | | | |
|---|---|---|---|---|
| 11,874,705 | B2* | 1/2024 | Lee | G09G 3/3233 |
| 12,148,378 | B2* | 11/2024 | Lee | G09G 3/32 |
| 2020/0111390 | A1* | 4/2020 | Kim | G09F 9/301 |
| 2021/0027671 | A1* | 1/2021 | Lee | G09F 9/301 |
| 2021/0066266 | A1* | 3/2021 | Jung | H10H 29/142 |
| 2021/0111167 | A1* | 4/2021 | Kang | H01L 25/167 |
| 2021/0126082 | A1* | 4/2021 | Yoon | H10K 50/856 |
| 2021/0134191 | A1* | 5/2021 | Jung | H10H 20/857 |
| 2023/0215873 | A1* | 7/2023 | Lim | H10D 86/411 |
| | | | | 257/91 |

FOREIGN PATENT DOCUMENTS

KR 10-2020-0012255 A 2/2020

* cited by examiner

*Primary Examiner* — William Boddie
(74) *Attorney, Agent, or Firm* — Seed Intellectual Property Law Group LLP

(57) ABSTRACT

In order to achieve the above-described technical benefits, according to an aspect of the present disclosure, a display device includes a stretchable lower substrate which includes an active area and a non-active area disposed at the outside of the active area; a pattern layer which is disposed on the lower substrate and includes a plurality of plate patterns and a plurality of line patterns; a plurality of pixels which is disposed above each of the plurality of plate patterns in the active area; and a plurality of connection lines which is disposed above the plurality of line patterns to connect the plurality of pixels, and the plurality of connection lines includes a high potential voltage line and a low potential voltage line which overlap each other in each of the plurality of plate patterns.

18 Claims, 11 Drawing Sheets

DISPLAY DEVICE

CROSS-REFERENCE TO RELATED APPLICATIONS

This application claims the priority of Korean Patent Application No. 10-2021-0192150 filed on Dec. 30, 2022, in the Korean Intellectual Property Office, the disclosure of which is incorporated herein by reference.

BACKGROUND

Technical Field

The present disclosure relates to a display device, and more particularly, to a display device in which a contact resistance of a power line is minimized or reduced.

Description of the Related Art

As display devices which are used for a monitor of a computer, a television, or a cellular phone, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Recently, a display device which is manufactured by forming a display unit and a wiring line on a flexible substrate such as plastic which is a flexible material so as to be stretchable in a specific direction and changed in various forms is getting attention as a next generation display device.

BRIEF SUMMARY

A technical benefit to be achieved by the present disclosure is to provide a display device which reduces a contact resistance of a power line.

Another technical benefit to be achieved by the present disclosure is to provide a display device with a reduced bezel size.

Still another technical benefit to be achieved by the present disclosure is to provide a display device which is capable of minimizing or reducing a defective rate of a landscape structure.

Technical benefits of the present disclosure are not limited to the above-mentioned technical benefits, and other technical benefits, which are not mentioned above, can be clearly understood by those skilled in the art from the following descriptions.

In order to achieve the above-described technical benefits, according to an aspect of the present disclosure, a display device includes a stretchable lower substrate which includes an active area and a non-active area disposed outside the active area; a pattern layer which is disposed on the lower substrate and includes a plurality of plate patterns and a plurality of line patterns; a plurality of pixels which is disposed above each of the plurality of plate patterns in the active area; and a plurality of connection lines which is disposed above the plurality of line patterns and connects the plurality of pixels to each other. The plurality of connection lines includes a high potential voltage line and a low potential voltage line which overlap each other in each of the plurality of plate patterns.

In accordance with various embodiments, a display device comprises a substrate, a pattern layer, a first pixel, a second pixel, a low potential voltage line and a high potential voltage line. The pattern layer is on the substrate and includes: a first plate pattern; a second plate pattern adjacent the first plate pattern; and a line pattern that connects the first plate pattern to the second plate pattern. The first pixel is on the first plate pattern. The second pixel is on the second plate pattern. The low potential voltage line overlaps the second plate pattern. The high potential voltage line overlaps the first plate pattern and the second plate pattern, and overlaps the low potential voltage line over the second plate pattern.

Other detailed matters of the example embodiments are included in the detailed description and the drawings.

According to the present disclosure, the power lines are disposed in the active area to overlap each other, thereby reducing a contact resistance of the power lines.

According to the present disclosure, the power line is disposed in the active area to reduce a bezel size.

According to the present disclosure, in the landscape display device, the power lines are disposed to overlap each other to minimize or reduce the defective rate of the data driver.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
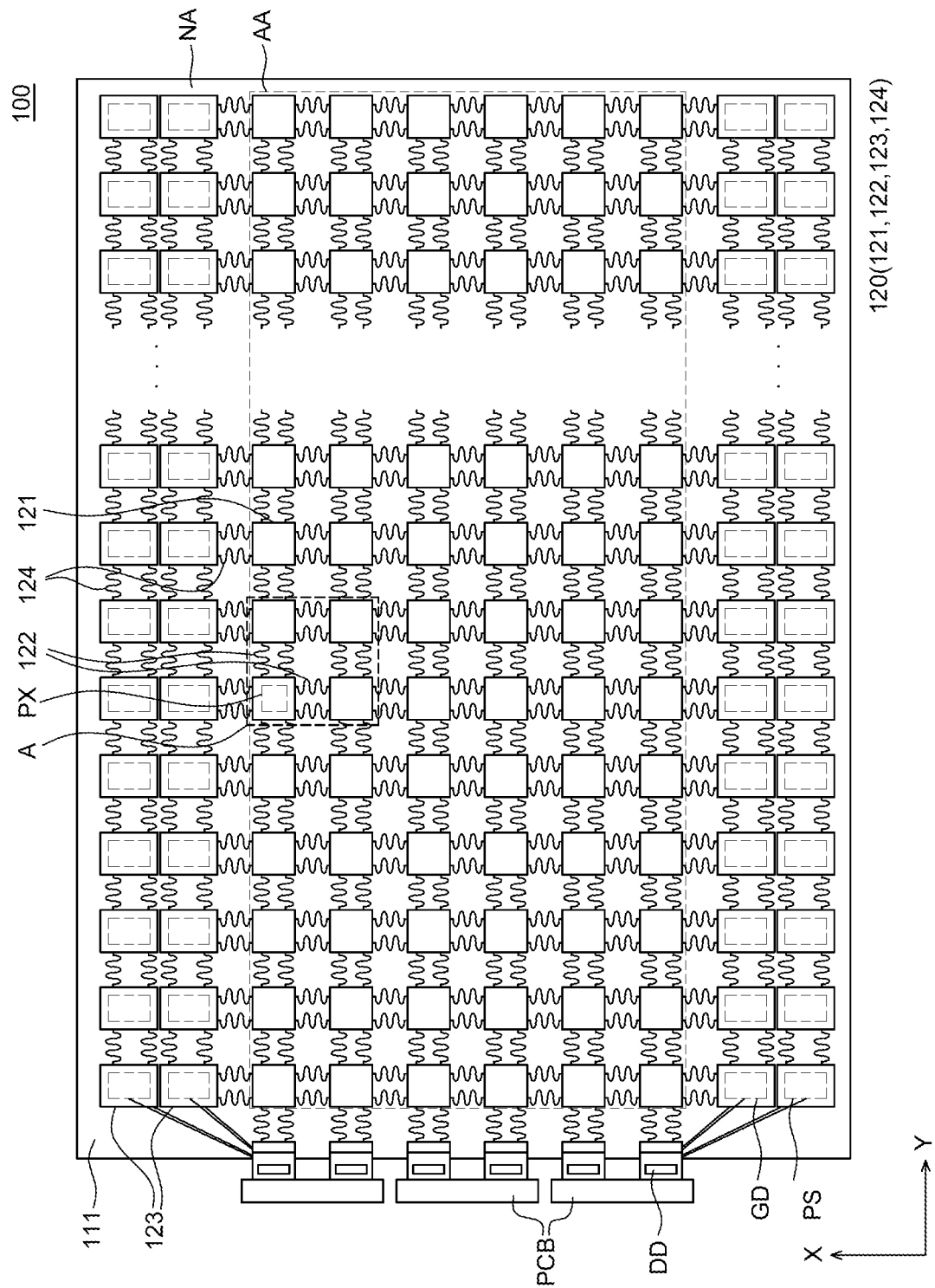
FIG. 1 is a plan view of a display device according to an example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error, tolerance or variation range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to example embodiments of the present disclosure will be described in detail with reference to accompanying drawings.

A display device according to an example embodiment of the present disclosure is a display device which is capable of displaying images even in a bent or extended state and is also referred to as a stretchable display device, a flexible display device and an extendable display device. As compared with the general display devices of the related art, the display device has not only a high flexibility, but also stretchability. Therefore, the user may bend or extend a display device and a shape of a display device may be freely changed in accordance with manipulation of a user. For example, when the user pulls the display device by holding ends of the display device, the display device may be extended to the pulling direction of the user. Alternatively, when the user disposes the display device on an outer surface which is not flat, the display device may be disposed to be bent in accordance with the shape of the outer surface, for example, of a wall. Further, when a force applied by the user is removed, the display device may return to its original shape.

Stretchable Substrate and Pattern Layer

Figure 2:
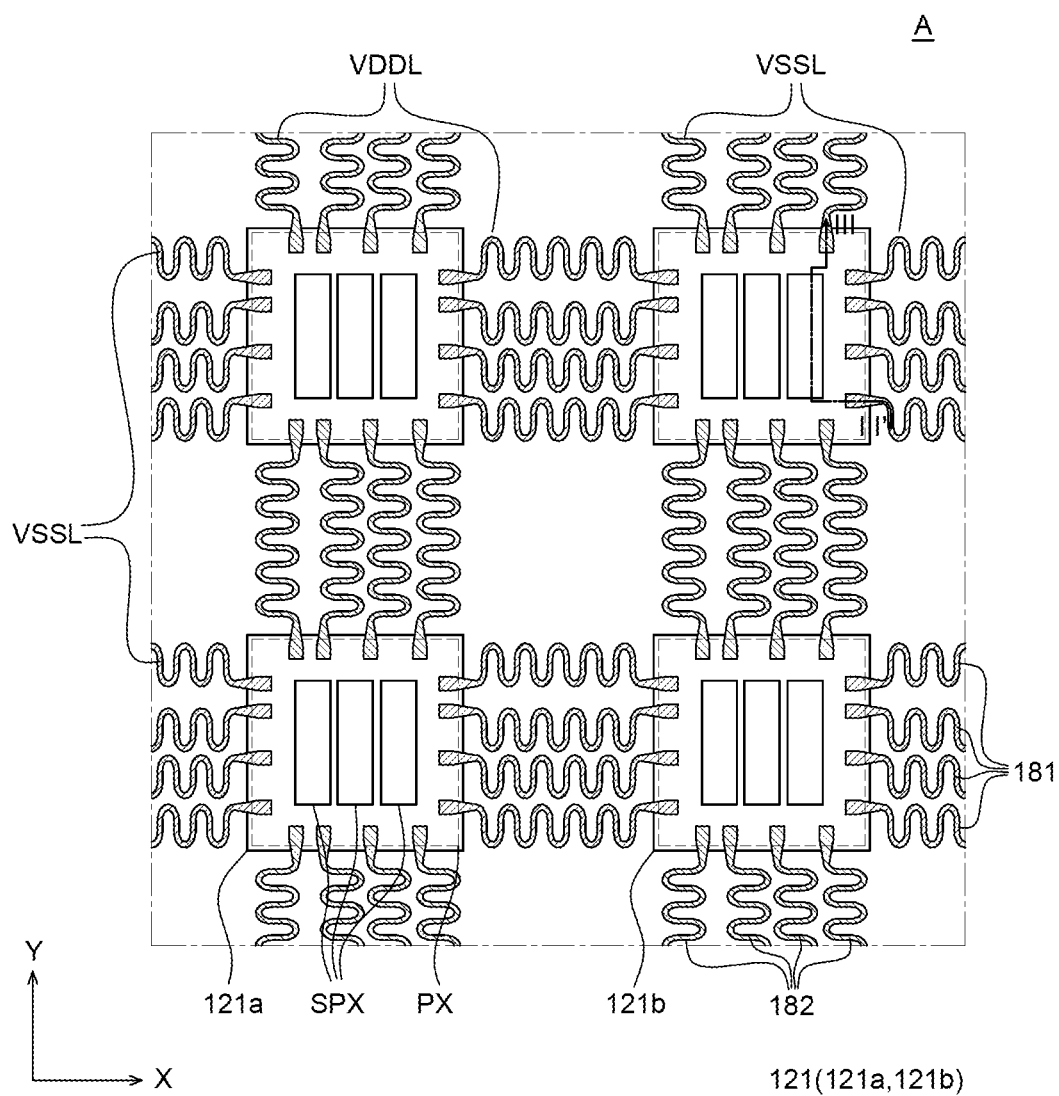
FIG. 2 is an enlarged plan view of an active area of a display device according to an example embodiment of the present disclosure.
Figure 3:
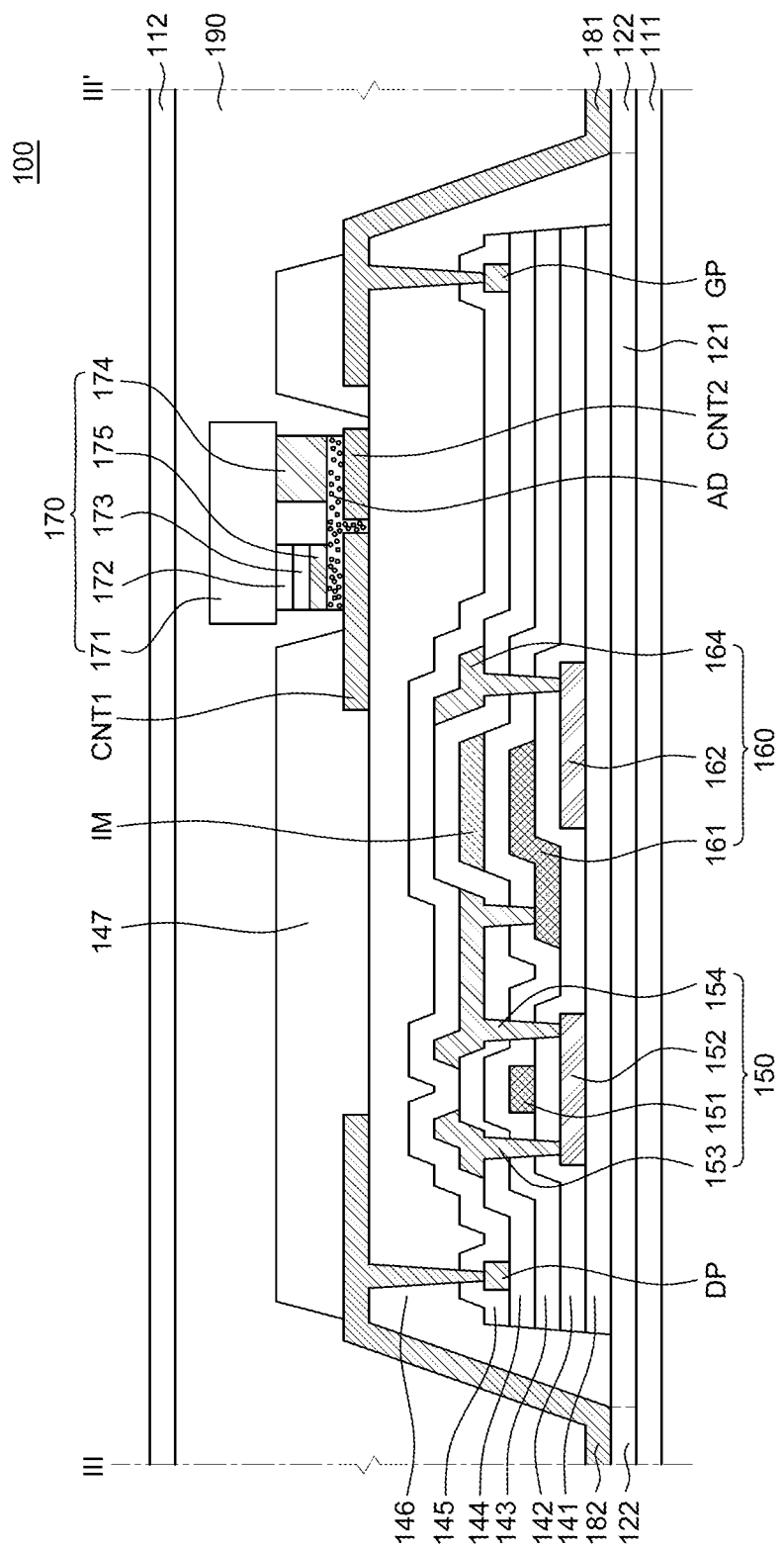
FIG. 3 is a cross-sectional view taken along the line III-III' of FIG. 2.
Figure 4:
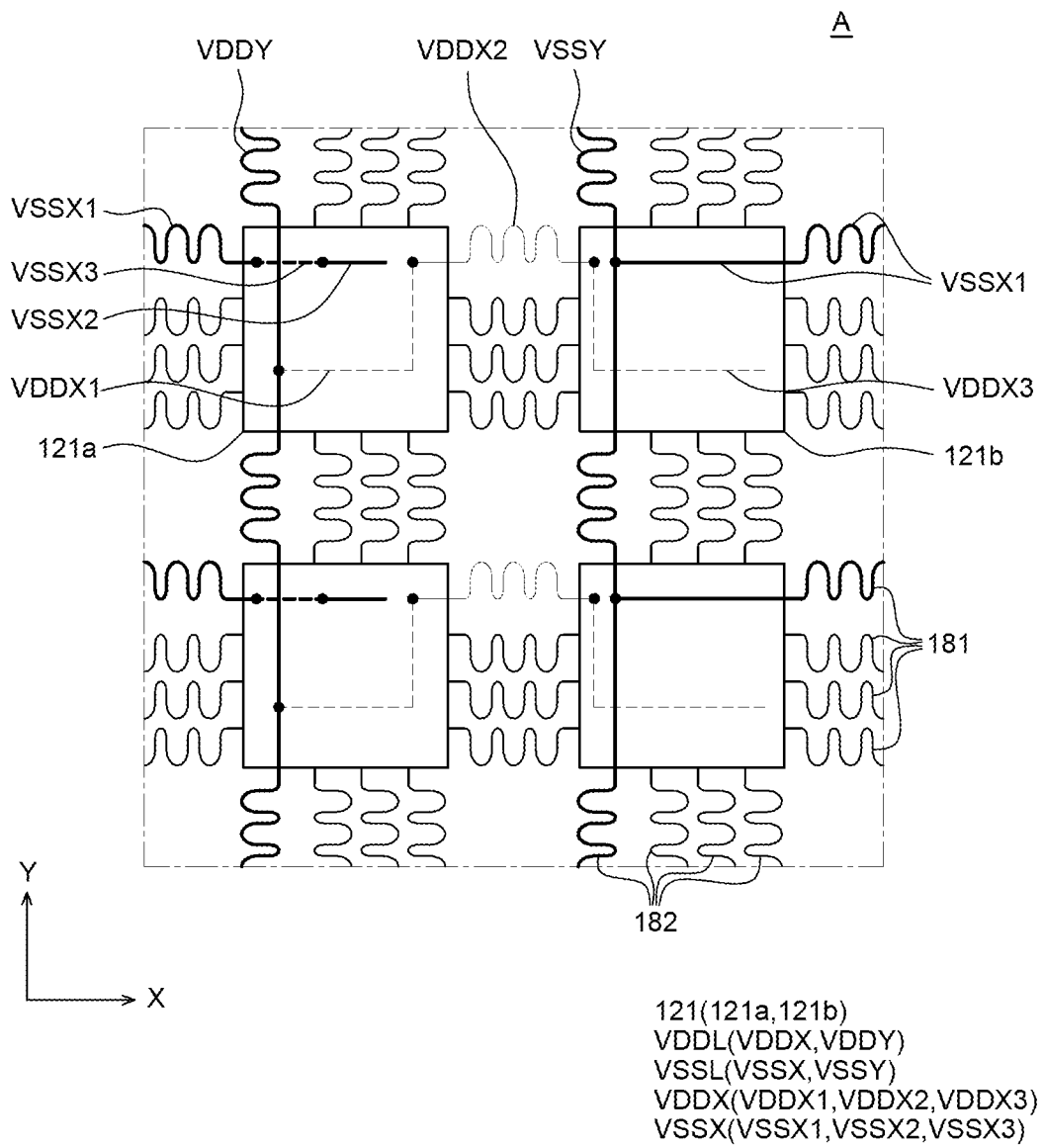
FIG. 4 is a schematic plan view for explaining a placement relationship of a high potential voltage line and a low potential voltage line of a display device according to an example embodiment of the present disclosure.

FIG. 1 is a plan view of a display device according to an example embodiment of the present disclosure. FIG. 2 is an enlarged plan view of an active area of a display device according to an example embodiment of the present disclosure. FIG. 3 is a cross-sectional view taken along the line III-III' of FIG. 2. FIG. 4 is a schematic plan view for explaining a placement relationship of a high potential voltage line and a low potential voltage line of a display device according to an example embodiment of the present disclosure. Specifically, FIG. 2 is an enlarged plan view of an area A illustrated in FIG. 1.

Referring to FIG. 1, a display device 100 according to an example embodiment of the present disclosure includes a lower substrate 111, a pattern layer 120, a plurality of pixels PX, a gate driver GD, a data driver DD, and a power supply PS. Referring to FIG. 3, the display device 100 according to the example embodiment of the present disclosure may further include a filling layer 190 and an upper substrate 112.

The lower substrate 111 is a substrate which supports and protects several components of the display device 100. The upper substrate 112 is a substrate which covers and protects several components of the display device 100. That is, the lower substrate 111 is a substrate which supports the pattern layer 120 on which the pixels PX, the gate driver GD, and the power supply PS are formed. The upper substrate 112 is a substrate which covers the pixels PX, the gate driver GD, and the power supply PS.

The lower substrate 111 and the upper substrate 112 may be flexible substrates that include an insulating material which is bendable or extendable. For example, the lower substrate 111 and the upper substrate 112 may be formed of a silicon rubber such as polydimethylsiloxane (PDMS) or an elastomer such as polyurethane (PU) or polytetrafluoroethylene (PTFE) and thus have a flexibility. Further, the materials of the lower substrate 111 and the upper substrate 112 may be the same, but are not limited thereto and may vary.

The lower substrate 111 and the upper substrate 112 are flexible substrates so as to be reversibly expandable and contractible. Accordingly, the lower substrate 111 may be referred to as a lower stretchable substrate, a lower stretching substrate, a lower extending substrate, a lower ductile substrate, a lower flexible substrate, a first stretchable substrate, a first stretching substrate, a first extending substrate, a first ductile substrate, or a first flexible substrate. The upper substrate 112 may be referred to as an upper stretchable substrate, an upper stretching substrate, an upper extending substrate, an upper ductile substrate, an upper flexible substrate, a second stretchable substrate, a second stretching substrate, a second extending substrate, a second ductile substrate, or a second flexible substrate. Further, moduli of elasticity of the lower substrate 111 and the upper substrate 112 may be several MPa to several hundreds of MPa. Further, a ductile breaking rate of the lower substrate 111 and the upper substrate 112 may be 100% or higher. Here, the ductile breaking rate refers to a stretching rate at a timing when an object to be stretched is broken or cracked. A thickness of the lower substrate may be 10 um to 1 mm, but is not limited thereto.

The lower substrate 111 may have an active area AA and a non-active area NA which is adjacent to and may enclose the active area AA on at least four sides. However, the active area AA and the non-active area are not mentioned to be limited to the lower substrate 111, but mentioned for the entire display device 100.

The active area AA is an area in which images are displayed in the display device 100. The plurality of pixels PX is disposed in the active area AA. Each pixel PX may include a display element and various driving elements for driving the display element. Various driving elements may refer to at least one thin film transistor (TFT) and a capacitor, but are not limited thereto. The plurality of pixels PX may be connected to various wiring lines, respectively. For example, each of the plurality of pixels PX may be connected to various wiring lines, such as a gate line, a data line, a high potential voltage line, a low potential voltage line, a reference voltage line, and an initialization voltage line.

The non-active area NA is an area where no image is displayed. The non-active area NA is an area adjacent to the active area AA. The non-active area NA is adjacent to the active area AA to enclose the active area AA on at least four sides. However, it is not limited thereto so that the non-active area NA corresponds to an area excluding the active area AA from the lower substrate 111 and may be modified and separated in various forms. Components for driving the plurality of pixels PX disposed in the active area AA are disposed in the non-active area NA. That is, the gate driver GD and the power supply PS may be disposed in the non-active area NA. In the non-active area NA, a plurality of pads electrically connected to the gate driver GD and the data driver DD may be disposed and each pad may be electrically connected to each of the plurality of pixels PX of the active area AA.

The pattern layer 120 including a plurality of first plate patterns 121 and a plurality of first line patterns 122 disposed in the active area AA and a plurality of second plate patterns 123 and a plurality of second line patterns 124 disposed in the non-active area NA is disposed on the lower substrate 111.

The plurality of first plate patterns 121 is disposed in the active area AA of the lower substrate 111 so that the plurality of pixels PX is formed on the plurality of first plate patterns 121. The plurality of first plate patterns 121 may be divided into a plurality of 1a-th plate patterns 121*a* and a plurality of 1b-th plate patterns 121*b* according to a placement shape of the high potential voltage line VDDL and the low potential voltage line VSSL. The plurality of second plate patterns 123 may be disposed in the non-active area NA of the lower substrate 111. The gate driver GD and the power supply PS are formed on the plurality of second plate patterns 123.

The plurality of first plate patterns 121 and the plurality of second plate patterns 123 which have been described above are formed in the form of separate islands. The plurality of first plate patterns 121 and the plurality of second plate patterns 123 may be individually separated. Therefore, the plurality of first plate patterns 121 and the plurality of second plate patterns 123 may be referred to as first island patterns and second island patterns or first individual patterns and second individual patterns.

Specifically, the gate driver GD may be mounted in the plurality of second plate patterns 123. The gate driver GD may be formed on the second plate pattern 123 in a gate in panel (GIP) manner when various elements on the first plate pattern 121 are manufactured. Therefore, various circuit elements included in the gate driver GD, such as various transistors, capacitors, and wiring lines, may be disposed on the plurality of second plate patterns 123. However, it is not limited thereto and the gate driver GD may be mounted in a chip on film (COF) manner.

The power supply PS may be mounted in the plurality of second plate patterns 123. The power supply PS is a plurality of power blocks patterned when various components on the first plate pattern 121 are manufactured and may be formed on the second plate pattern 123. Therefore, power blocks disposed on different layers may be disposed on the second plate pattern 123. Accordingly, a lower power block and an upper power block may be sequentially disposed on the second plate pattern 123. A low potential voltage may be applied to the lower power block and a high potential voltage may be applied to the upper power block. Therefore, the low potential voltage may be supplied to the plurality of pixels PX by means of the lower power block. The high potential voltage may be supplied to the plurality of pixels PX by means of the upper power block.

Referring to FIG. 1, sizes of the plurality of second plate patterns 123 may be larger than sizes of the plurality of first plate patterns 121. Specifically, a size of each of the plurality of second plate patterns 123 may be larger than a size of each of the plurality of first plate patterns 121. As described above, the gate driver GD is disposed on each of the plurality of second plate patterns 123 and one stage of the gate driver GD is disposed in each of the plurality of second plate patterns 123. Therefore, an area occupied by various circuit elements which belong to one stage of the gate driver GD may be relatively larger than an area occupied by the pixel PX so that a size of each of the plurality of second plate patterns 123 may be larger than a size of each of the plurality of first plate patterns 121.

Even though in FIG. 1, the plurality of second plate patterns 123 is disposed on both sides of the non-active area NA in the first direction X, it is not limited thereto and may be disposed in an arbitrary area of the non-active area NA. Further, the plurality of 1a-th plate patterns 121*a*, the plurality of 1b-th plate patterns 121*b*, and the plurality of second plate patterns 123 are illustrated as a rectangular shape, but they are not limited thereto. However, the plurality of 1a-th plate patterns 121*a*, the plurality of 1b-th plate patterns 121*b*, and the plurality of second plate patterns 123 may vary in various forms.

Referring to FIGS. 1 and 3, the pattern layer 120 may further include a plurality of first line patterns 122 disposed in the active area AA and a plurality of second line patterns 124 disposed in the non-active area NA.

The plurality of first line patterns 122 is patterns which are disposed in the active area AA and connect the plurality of 1a-th plate patterns 121*a* or the plurality of 1b-th plate patterns 121*b* which are adjacent to each other and is referred to as first connection patterns. That is, the plurality of first line patterns 122 is disposed between the plurality of first plate patterns 121.

The plurality of second line patterns 124 is patterns which are disposed in the non-active area NA and connect the first plate patterns 121 and the second plate patterns 123 which are adjacent to each other or connect a plurality of second plate patterns 123 which is adjacent to each other. Accordingly, the plurality of second line patterns 124 may be referred to as second connection patterns. The plurality of second line patterns 124 may be disposed between the first plate pattern 121 and the second plate pattern 123 which are adjacent to each other and between respective ones of the plurality of second plate patterns 123 which are adjacent to each other.

Referring to FIG. 1, the plurality of first line patterns 122 and the plurality of second line patterns 124 have a wavy shape. For example, the plurality of first line patterns 122 and the plurality of second line patterns 124 have a sinusoidal shape. However, the shape of the plurality of first line patterns 122 and the plurality of second line patterns 124 is not limited thereto. For example, the plurality of first line patterns 122 and the plurality of second line patterns 124 may extend in a zigzag pattern. Further, the plurality of first line patterns 122 and the plurality of second line patterns 124 may have various shapes such as a plurality of rhombic substrates which is connected at their vertexes to be extended. Further, the number and the shape of the plurality of first line patterns 122 and the plurality of second line patterns 124 illustrated in FIG. 1 are examples and may be changed in various forms depending on the design.

The plurality of first plate patterns 121, the plurality of first line patterns 122, the plurality of second plate patterns 123, and the plurality of second line patterns 124 are rigid patterns. That is, the plurality of first plate patterns 121, the plurality of first line patterns 122, the plurality of second plate patterns 123, and the plurality of second line patterns 124 may be more rigid than the lower substrate 111 and the upper substrate 112. Accordingly, moduli of elasticity of the plurality of first plate patterns 121, the plurality of first line patterns 122, the plurality of second plate patterns 123, and the plurality of second line patterns 124 may be higher than a modulus of elasticity of the lower substrate 111. The modulus of elasticity is a parameter representing a rate of deformation against the stress applied to the substrate and the higher the modulus of elasticity, the higher the hardness. Therefore, the plurality of first plate patterns 121, the plurality of first line patterns 122, the plurality of second plate patterns 123, and the plurality of second line patterns 124 may be referred to as a plurality of first rigid patterns, a plurality of second rigid patterns, a plurality of third rigid patterns, and a plurality of fourth rigid patterns, respectively. Moduli of elasticity of the plurality of first plate patterns 121, the plurality of first line patterns 122, the plurality of second plate patterns 123, and the plurality of second line patterns 124 may be 1000 times higher than the moduli of elasticity of the lower substrate 111 and the upper substrate 112, but is not limited thereto.

The plurality of first plate patterns 121, the plurality of first line patterns 122, the plurality of second plate patterns 123, and the plurality of second line patterns 124 which are a plurality of rigid patterns may be formed of a plastic material having a lower flexibility than the lower substrate 111 and the upper substrate 112. For example, the plurality of first plate patterns 121, the plurality of first line patterns 122, the plurality of second plate patterns 123, and the plurality of second line patterns 124 are formed of polyimide (PI), polyacrylate, or polyacetate. At this time, the plurality of first plate patterns 121, the plurality of first line patterns 122, the plurality of second plate patterns 123, and the plurality of second line patterns 124 may be formed of the same material, but is not limited thereto and may be formed of different materials. When the plurality of first plate patterns 121, the plurality of first line patterns 122, the plurality of second plate patterns 123, and the plurality of second line patterns 124 are formed of the same material, the patterns may be integrally formed. It should be understood that patterns being "integrally formed" includes the meaning of formed at the same time in the same process operation, and does not require that the patterns be in physical contact with each other.

In some example embodiments, the lower substrate 111 may include a plurality of first lower patterns and a second lower pattern. The plurality of first lower patterns may be an area of the lower substrate 111 overlapping the plurality of first plate patterns 121 and the plurality of second plate patterns 123. The second lower pattern may be an area which does not overlap the plurality of first plate patterns 121 and the plurality of second plate patterns 123.

Further, the upper substrate 112 includes a plurality of first upper patterns and a second upper pattern. The plurality of first upper patterns may be an area overlapping the plurality of the first plate patterns 121 and the plurality of second plate patterns 123 of the upper substrate 112, but the second upper pattern may be an area which does not overlap the plurality of the first plate patterns 121 and the plurality of second plate patterns 123.

At this time, moduli of elasticity of the plurality of first lower patterns and the first upper pattern may be higher than moduli of elasticity of the second lower pattern and the second upper pattern. For example, the plurality of first lower patterns and the first upper pattern may be formed of the same material as the plurality of first plate patterns 121 and the plurality of second plate patterns 123. The second lower pattern and the second upper pattern may be formed of a material having a modulus of elasticity lower than those of the plurality of first plate patterns 121 and the plurality of second plate patterns 123.

That is, the first lower pattern and the first upper pattern may be formed of polyimide (PI), polyacrylate, or polyacetate. Further, the second lower pattern and the second upper pattern may be formed of silicon rubber such as polydimethylsiloxane (PDMS) or elastomer such as polyurethane (PU) or polytetrafluoroethylene.

Driving Element of Non-Active Area

The gate driver GD is a component which supplies a gate voltage to the plurality of pixels PX disposed in the active area AA. The gate driver GD includes a plurality of stages formed on the plurality of second plate patterns 123 and each stage of the gate driver GD may be electrically connected to each other. Accordingly, a gate voltage output from any one of stages may be transmitted to the other stage. Each stage may sequentially supply the gate voltage to the plurality of pixels PX connected to each stage.

The power supply PS is connected to the gate driver GD to supply a gate driving voltage and a gate clock voltage. The power supply PS is connected to the plurality of pixels PX to supply a pixel driving voltage to each of the plurality of pixels PX. The power supply PS may also be formed on the plurality of second plate patterns 123. That is, the power supply PS may be formed to be adjacent to the gate driver GD on the second plate pattern 123. Power supplies PS formed on the plurality of second plate patterns 123 are electrically connected to the gate driver GD and the plurality of pixels PX. That is, the plurality of power supplies PS formed on the plurality of second plate patterns 123 may be connected by a gate power supply connection line and a pixel power supply connection line. Therefore, each of the plurality of power supplies PS supplies a gate driving voltage, a gate clock voltage, and a pixel driving voltage.

The printed circuit board PCB is a component which transmits signals and voltages for driving the display element from a control unit or controller to the display element. Therefore, the printed circuit board PCB may also be referred to as a driving substrate. A control unit such as an IC chip or a circuit may be mounted on the printed circuit board PCB. Further, on the printed circuit board PCB, a memory or a processor may also be mounted. The printed circuit board PCB provided in the display device 100 may include a stretching area and a non-stretching area to ensure stretchability. In the non-stretching area, an IC chip, a circuit unit, a memory, and a processor are mounted and in the stretching area, wiring lines which are electrically connected to the IC chip, the circuit unit, the memory, and the processor may be disposed.

The data driver DD is a component which supplies a data voltage to the plurality of pixels PX disposed in the active area AA. The data driver DD is configured as an IC chip so that it is also referred to as a data integrated circuit D-IC. The data driver DD may be mounted in the non-stretching area of the printed circuit board PCB. That is, the data driver DD may be mounted on the printed circuit board PCB in the form of a chip on board (COB). However, even though in FIG. 1, it is illustrated that the data driver DD is mounted in a chip on film (COF) manner, it is not limited thereto and the data driver DD may be mounted by a chip on board (COB), a chip on glass (COG), or a tape carrier package (TCP) manner.

Further, even though in FIG. 1, one data driver DD is disposed so as to correspond to one line of the first plate patterns 121 disposed in the active area AA, it is not limited thereto. That is, one data driver DD may be disposed so as to correspond to a plurality of lines of first plate patterns 121.

Hereinafter, the active area AA of the display device 100 according to the example embodiment of the present disclosure will be described in more detail with reference to FIGS. 2 to 4 together.

Planar and Cross-Sectional Structures of Active Area

Referring to FIG. 2, the plurality of 1a-th plate patterns 121a and the plurality of 1b-th plate patterns 121b are disposed on the lower substrate 111 in the active area AA. The plurality of 1a-th plate patterns 121a and the plurality of 1b-th plate patterns 121b are alternate from each other and are spaced apart from each other to be disposed on the lower substrate 111. For example, the plurality of 1a-th plate patterns 121a and the plurality of 1b-th plate patterns 121b are alternately disposed in the same row of a first direction X. The plurality of 1a-th plate patterns 121a and the plurality of 1b-th plate patterns 121b are disposed in different columns of a second direction Y. For example, as illustrated in FIG. 1, the plurality of 1a-th plate patterns 121a and the plurality of 1b-th plate patterns 121b may be disposed on the lower substrate 111 in a matrix, but is not limited thereto.

Referring to FIGS. 2 and 3, a pixel PX including the plurality of sub pixels SPX is disposed on the first plate pattern 121. Each sub pixel SPX may include a light emitting diode 170 which is a display element, and a driving transistor 160 and a switching transistor 150 which drive the light emitting diode 170. However, in the sub pixel SPX, the display element is not limited to the light emitting diode, and may also be changed to an organic light emitting diode. For example, the plurality of sub pixels SPX may include a red sub pixel, a green sub pixel, and a blue sub pixel, but is not limited thereto and colors of the plurality of sub pixels SPX may be modified to various colors as needed. For example, the plurality of sub pixels SPX may include a white sub pixel.

The plurality of sub pixels SPX may be connected to the plurality of connection lines 181 and 182. That is, the plurality of sub pixels SPX may be electrically connected to the first connection line 181 extending in the first direction X. The plurality of sub pixels SPX may be electrically connected to the second connection line 182 extending in the second direction Y.

Referring to FIG. 2, at least four of the plurality of first connection lines 181 may be connected to one pixel PX. At least four of the plurality of second connection lines 182 may be connected to one pixel PX. One of the plurality of first connection lines 181 is a high potential voltage line VDDL and one of the plurality of second connection lines 182 is a low potential voltage line VSSL. In other words, the high potential voltage line VDDL and the low potential voltage line VSSL may be disposed in the active area AA and the high potential voltage line VDDL and the low potential voltage line VSSL may be disposed in each of the plurality of 1a-th plate patterns 121a and the plurality of 1b-th plate patterns 121b to overlap each other.

Hereinafter, a cross-sectional structure of the active area AA will be described in detail with reference to FIG. 3. FIG. 3 is a cross-sectional view of the 1b-th plate pattern 121b of FIG. 2 and for description of the common characteristic of the 1a-th plate pattern 121a and the 1b-th plate pattern 121b, it will be described as the first plate pattern 121.

Referring to FIG. 3, a plurality of inorganic insulating layers is disposed on the plurality of first plate patterns 121. For example, the plurality of inorganic insulating layers may include a buffer layer 141, a gate insulating layer 142, a first interlayer insulating layer 143, a second interlayer insulating layer 144, and a passivation layer 145, but is not limited thereto. Therefore, on the plurality of first plate patterns 121, various inorganic insulating layers may be additionally disposed or one or more of the buffer layer 141, the gate insulating layer 142, the first interlayer insulating layer 143, the second interlayer insulating layer 144, and the passivation layer 145 may be omitted.

Specifically, the buffer layer 141 is disposed on the plurality of first plate patterns 121. The buffer layer 141 is formed on the plurality of first plate patterns 121 to protect various components of the display device 100 from permeation of moisture (H2O) and oxygen (O2) from the outside of the lower substrate 111 and the plurality of first plate patterns 121. The buffer layer 141 may be configured by an insulating material. For example, the buffer layer 141 may be configured by a single layer or a double layer formed of at least one of silicon nitride (SiNx), silicon oxide (SiOx), and silicon oxynitride (SiON). However, the buffer layer 141 may be omitted depending on a structure or a characteristic of the display device 100.

At this time, the buffer layer 141 may be formed only in an area where the lower substrate 111 overlaps the plurality of first plate patterns 121 and the plurality of second plate patterns 123. As described above, the buffer layer 141 may be formed of an inorganic material so that the buffer layer 141 may be easily cracked or damaged during a process of stretching the display device 100. Therefore, the buffer layer 141 is not formed in an area between the plurality of first plate patterns 121 and the plurality of second plate patterns 123. Instead, the buffer layer 141 is patterned to have a shape of the plurality of first plate patterns 121 and the plurality of second plate patterns 123 to be disposed only above the plurality of first plate patterns 121 and the plurality of second plate patterns 123. Therefore, in the display device 100 according to the example embodiment of the present disclosure, the buffer layer 141 is formed only in an area overlapping the plurality of first plate patterns 121 and the plurality of second plate patterns 123 which are rigid patterns. Therefore, even though the display device 100 is bent or extended to be deformed, the damage of various components of the display device 100 may be suppressed.

Referring to FIG. 3, a switching transistor 150 including a gate electrode 151, an active layer 152, a source electrode 153, and a drain electrode 154 and a driving transistor 160 including a gate electrode 161, an active layer 162, a source electrode and a drain electrode 164 are formed on the buffer layer 141.

First, referring to FIG. 3, the active layer 152 of the switching transistor 150 and the active layer 162 of the driving transistor 160 are disposed on the buffer layer 141. For example, the active layer 152 of the switching transistor 150 and the active layer 162 of the driving transistor 160 may be formed of oxide semiconductors. For example, the active layer 152 may be formed of indium-gallium-zinc oxide, indium-gallium oxide, or indium-zinc oxide. Alternatively, the active layer 152 of the switching transistor 150 and the active layer 162 of the driving transistor 160 may be formed of amorphous silicon (a-Si), polycrystalline silicon (poly-Si), or an organic semiconductor.

The gate insulating layer 142 is disposed on the active layer 152 of the switching transistor 150 and the active layer 162 of the driving transistor 160. The gate insulating layer 142 is a layer which electrically insulates the gate electrode 151 of the switching transistor 150 from the active layer 152 of the switching transistor 150 and electrically insulates the gate electrode 161 of the driving transistor 160 from the active layer 162 of the driving transistor 160. The gate insulating layer 142 may be formed of an insulating material. For example, the gate insulating layer 142 may be configured by a single layer of silicon nitride (SiNx) or silicon oxide (SiOx) which is an inorganic material or a multiple layer of silicon nitride (SiNx) or silicon oxide (SiOx), but it is not limited thereto.

The gate electrode 151 of the switching transistor 150 and the gate electrode 161 of the driving transistor 160 are disposed on the gate insulating layer 142. The gate electrode 151 of the switching transistor 150 and the gate electrode 161 of the driving transistor 160 are disposed on the gate insulating layer 142 to be spaced apart from each other. The gate electrode 151 of the switching transistor 150 overlaps the active layer 152 of the switching transistor 150 and the gate electrode 161 of the driving transistor 160 overlaps the active layer 162 of the driving transistor 160.

The gate electrode 151 of the switching transistor 150 and the gate electrode 161 of the driving transistor 160 may be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

The first interlayer insulting layer 143 is disposed on the gate electrode 151 of the switching transistor 150 and the gate electrode 161 of the driving transistor 160. The first interlayer insulating layer 143 insulates the gate electrode 161 of the driving transistor 160 from an intermediate metal layer IM. The first interlayer insulating layer 143 may be formed of an inorganic material, similar to the buffer layer 141. For example, the first interlayer insulating layer 143 may be configured by a single layer of silicon nitride (SiNx) or silicon oxide (SiOx) which is an inorganic material or a multiple layer of silicon nitride (SiNx) or silicon oxide (SiOx), but it is not limited thereto.

The intermediate metal layer IM is disposed on the first interlayer insulating layer 143. The intermediate metal layer IM overlaps the gate electrode 161 of the driving transistor 160. Therefore, a storage capacitor is formed in an overlapping area of the intermediate metal layer IM and the gate electrode 161 of the driving transistor 160. Specifically, the gate electrode 161 of the driving transistor 160, the first interlayer insulating layer 143, and the intermediate metal layer IM form the storage capacitor. However, the placement area of the intermediate metal layer IM is not limited thereto and the intermediate metal layer IM overlaps the other electrode to form the storage capacitor in various forms.

The intermediate metal layer IM may be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

The second interlayer insulating layer 144 is disposed on the intermediate metal layer IM. The second interlayer insulating layer 144 insulates the gate electrode 151 of the switching transistor 150 from the source electrode 153 and the drain electrode 154 of the switching transistor 150. The second interlayer insulating layer 144 insulates the intermediate metal layer IM from the source electrode and the drain electrode 164 of the driving transistor 160. The second interlayer insulating layer 144 may be formed of an inorganic material, similar to the buffer layer 141. For example, the second interlayer insulating layer 144 may be configured by a single layer of silicon nitride (SiNx) or silicon oxide (SiOx) which is an inorganic material or a multiple layer of silicon nitride (SiNx) or silicon oxide (SiOx), but it is not limited thereto.

The source electrode 153 and the drain electrode 154 of the switching transistor 150 are disposed on the second interlayer insulating layer 144. The source electrode and the drain electrode 164 of the driving transistor 160 are disposed on the second interlayer insulating layer 144. The source electrode 153 and the drain electrode 154 of the switching transistor 150 are disposed on the same layer to be spaced apart from each other. Even though in FIG. 1, the source electrode of the driving transistor 160 is omitted, the source electrode of the driving transistor 160 is also disposed to be spaced apart from the drain electrode 164 on the same layer. In the switching transistor 150, the source electrode 153 and the drain electrode 154 may be in contact with the active layer 152 through a contact hole to be electrically connected to the active layer 152. In the driving transistor 160, the source electrode and the drain electrode 164 may be in contact with the active layer 162 through a contact hole to be electrically connected to the active layer 162. The drain electrode 154 of the switching transistor 150 is in contact with the gate electrode 161 of the driving transistor 160 through a contact hole to be electrically connected to the gate electrode 161 of the driving transistor 160.

The source electrode 153 and the drain electrodes 154 and 164 may be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

Further, in this specification, even though it is described that the driving transistor 160 has a coplanar structure, various transistors such as a staggered structure may also be used. Further, in this specification, the transistor may be formed not only to have a top gate structure, but also to have a bottom gate structure.

A gate pad GP and a data pad DP may be disposed on the second interlayer insulating layer 144.

Specifically, the gate pad GP is a pad which transmits a gate voltage to the plurality of sub pixels SPX. The gate pad GP is connected to the first connection line 181 through a contact hole. The gate voltage supplied from the first connection line 181 may be transmitted to the gate electrode 151 of the switching transistor 150 from the gate pad GP through a wiring line formed on the first plate pattern 121.

Referring to FIG. 3, the data pad DP is a pad which transmits a data voltage to the plurality of sub pixels SPX. The data pad DP is connected to the second connection line 182 through a contact hole. The data voltage supplied from the second connection line 182 may be transmitted to the source electrode 153 of the switching transistor 150 from the data pad DP through a wiring line formed on the first plate pattern 121.

The gate pad GP and the data pad DP may be formed of the same material as the source electrode 153 and the drain electrodes 154 and 164, but are not limited thereto.

Referring to FIG. 3, the passivation layer 145 is formed on the switching transistor 150 and the driving transistor 160. That is, the passivation layer 145 covers the switching transistor 150 and the driving transistor 160 to protect the switching transistor 150 and the driving transistor 160 from the permeation of moisture and oxygen. The passivation layer 145 may be formed of an inorganic material and may be a single layer or a double layer, but is not limited thereto.

The gate insulating layer 142, the first interlayer insulating layer 143, the second interlayer insulating layer 144, and the passivation layer 145 are patterned to be formed only in an area overlapping the plurality of first plate patterns 121. The gate insulating layer 142, the first interlayer insulating layer 143, the second interlayer insulting layer 144, and the passivation layer 145 are also formed of the inorganic material, similar to the buffer layer 141. Therefore, the gate insulating layer 142, the first interlayer insulating layer 143, the second interlayer insulating layer 144, and the passivation layer 145 may also be easily cracked to be damaged during the process of stretching the display device 100. Therefore, the gate insulating layer 142, the first interlayer insulating layer 143, the second interlayer insulating layer 144, and the passivation layer 145 are not formed in an area between the plurality of first plate patterns 121. However, the gate insulating layer 142, the first interlayer insulating layer 143, the second interlayer insulating layer 144, and the passivation layer 145 are patterned to have a shape of the plurality of first plate patterns 121 to be formed only above the plurality of first plate patterns 121.

The planarization layer 146 is formed on the passivation layer 145. The planarization layer 146 planarizes upper portions of the switching transistor 150 and the driving transistor 160. The planarization layer 146 may include a single layer or a plurality of layers and may be formed of an organic material. Therefore, the planarization layer 146 may also be referred to as an organic insulating layer. For example, the planarization layer 146 may be formed of an acrylic organic material, but is not limited thereto.

Referring to FIG. 3, the planarization layer 146 may be disposed so as to cover top surfaces and side surfaces of the buffer layer 141, the gate insulating layer 142, the first interlayer insulating layer 143, the second interlayer insulating layer 144, and the passivation layer 145 on the plurality of first plate patterns 121. The planarization layer 146 encloses the buffer layer 141, the gate insulating layer 142, the first interlayer insulating layer 143, the second interlayer insulating layer 144, and the passivation layer 145 together with the plurality of first plate patterns 121. Specifically, the planarization layer 146 may be disposed so as to cover a top surface and a side surface of the passivation layer 145, a side surface of the first interlayer insulating layer 143, a side surface of the second interlayer insulating layer 144, a side surface of the gate insulating layer 142, a side surface of the buffer layer 141, and a part of a top surface of the plurality of first plate patterns 121. Therefore, the planarization layer 146 may compensate for a step on the side surfaces of the buffer layer 141, the gate insulating layer 142, the first interlayer insulating layer 143, the second interlayer insulating layer 144, and the passivation layer 145. Further, the planarization layer 145 enhances an adhesive strength of the planarization layer 145 and the connection lines 181 and 182 disposed on the side surface of the planarization layer 146.

Referring to FIG. 3, an inclination angle of the side surface of the planarization layer 146 may be smaller than an inclination angle formed by side surfaces of the buffer layer 141, the gate insulating layer 142, the first interlayer insulating layer 143, the second interlayer insulating layer 144, and the passivation layer 145. For example, the side surface of the planarization layer 146 may have a slope which is gentler than a slope formed by the side surface of the passivation layer 145, the side surface of the first interlayer insulating layer 143, the side surface of the second interlayer insulating layer 144, the side surface of the gate insulating layer 142, and the side surface of the buffer layer 141. Therefore, the connection lines 181 and 182 which are disposed to be in contact with the side surface of the planarization layer 146 are disposed with a gentle slope so that when the display device 100 is stretched, the stress generated in the connection lines 181 and 182 may be reduced. Further, the side surface of the planarization layer 146 has a relatively gentle slope so that the crack of the connection lines 181 and 182 or separation thereof from the side surface of the planarization layer 146 may be suppressed.

Referring to FIGS. 2 to 4, the connection lines 181 and 182 refer to wiring lines which electrically connect the pads on the plurality of 1a-th plate patterns 121a and the plurality of 1b-th plate patterns 121b. A portion of the connection lines 181 and 182 are disposed on the plurality of 1a-th plate patterns 121a and the plurality of 1b-th plate patterns. As described above, the connection lines 181 and 182 disposed on the first line pattern 122 may also extend onto the plurality of first plate patterns 121 to be electrically connected to the gate pad GP and the data pad DP on the plurality of first plate patterns 121. Referring to FIG. 1, the first line pattern 122 is not disposed in an area where the connection lines 181 and 182 are not disposed, among areas between the plurality of first plate patterns 121.

The connection lines 181, 182 include a first connection line 181 and a second connection line 182. The first connection line 181 and the second connection line 182 are disposed between the plurality of first plate patterns 121. Specifically, the first connection line 181 refers to a wiring line extending in the first direction X between the plurality of first plate patterns 121, among the connection lines 181 and 182. The second connection line 182 refers to a wiring line extending in the second direction Y between the plurality of first plate patterns 121, among the connection lines 181 and 182.

The connection lines 181 and 182 may be formed of a metal material such as copper (Cu), aluminum (Al), titanium (Ti), and molybdenum (Mo) or a stacked structure of metal materials such as copper/molybdenum-titanium (Cu/MoTi) or titanium/aluminum/titanium (Ti/Al/Ti), but is not limited thereto.

In the case of a display panel of a general display device, various wiring lines such as a plurality of gate lines and a plurality of data lines extend between the plurality of sub pixels as a straight line and the plurality of sub pixels is connected to one signal line. Therefore, in the display panel of the general display device, various wiring lines, such as a gate line, a data line, a high potential voltage line, a low potential voltage line, and a reference voltage line, extend from one side to the other side of the display panel of the organic light emitting display device without being disconnected on the substrate.

In contrast, in the display device 100 according to the example embodiment of the present disclosure, various wiring lines, such as a gate line, a data line, a high potential voltage line VDDL, a low potential voltage line VSSL, a reference voltage line, and an initialization voltage line having a straight line shape which are considered to be used for the display panel of the general organic light emitting display device, is disposed on the plurality of first plate patterns 121 and the plurality of second plate patterns 123.

In the display device 100 according to the example embodiment of the present disclosure, the pads on the two adjacent first plate patterns 121 may be connected by the connection lines 181 and 182. Accordingly, the connection lines 181 and 182 electrically connect the gate pads GP or the data pads DP on two adjacent first plate patterns 121. Accordingly, the display device 100 according to the example embodiment of the present disclosure may include a plurality of connection lines 181 and 182 so as to electrically connect various wiring lines, such as a gate line, a data line, a high potential voltage line VDDL, a low potential voltage line VSSL, and a reference voltage line, between the plurality of first plate patterns 121.

Referring to FIG. 2, the high potential voltage line VDDL is disposed on the plurality of first plate patterns 121 so as to overlap the low potential voltage line VSSL.

The high potential voltage line VDDL which is one wiring line extending in the first direction X, among various wiring lines which may be included in the display device 100, may be electrically connected by the first connection line 181. Further, the low potential voltage line VSSL which is one wiring line extending in the second direction Y is electrically connected by the second connection line 182.

As illustrated in FIG. 4, the high potential voltage line VDDL includes a high potential voltage main line VDDY extending in the second direction Y and a high potential voltage sub line VDDX which is electrically connected to the high potential voltage main line VDDY and extends in the first direction X. The high potential voltage main line VDDY is disposed above the plurality of 1a-th plate patterns 121a and between the plurality of 1a-th plate patterns 121a to extend in the second direction Y. In order to transmit a high potential voltage of the high potential main line VDDY of the second direction Y to the plurality of 1b-th plate patterns 121b, the high potential voltage sub line VDDX is electrically connected to the high potential voltage main line VDDY disposed on the plurality of 1a-th plate patterns 121a. By doing this, the high potential voltage sub line VDDX extends to the plurality of 1b-th plate patterns 121b adjacent to the plurality of 1a-th plate patterns 121a. It should be understood that the locations of high potential voltage line VDDL and the low potential voltage line VSSL may be reversed from that shown in FIGS. 4-8.

Each high potential voltage sub line VDDX includes a first high potential voltage sub line VDDX1, a second high potential voltage sub line VDDX2, and a third high potential voltage sub line VDDX3. Here, each first high potential voltage sub line VDDX1 is disposed below the corresponding high potential voltage main line VDDY on one of the plurality of 1a-th plate patterns 121a. Each second high potential voltage sub line VDDX2 is disposed on one of the plurality of line patterns 122 and each third high potential voltage sub line VDDX3 is disposed below the low potential voltage main line VSSY on one of the plurality of 1b-th plate patterns 121b.

The low potential voltage line VSSL includes a low potential voltage main line VSSY extending in the second direction Y and a low potential voltage sub line VSSX which is electrically connected to the low potential voltage main line VSSY and extends in the first direction X. The low potential voltage main line VSSY is disposed above the plurality of 1b-th plate patterns 121b and between the plurality of 1b-th plate patterns 121b to extend in the second direction Y. In order to apply a low potential voltage of the low potential voltage main line VSSY of the second direction Y to the plurality of 1a-th plate patterns 121a, each low potential voltage sub line VSSX includes a first low potential voltage sub line VSSX1, a second low potential voltage sub line VSSX2, and a third low potential voltage sub line VSSX3. Here, each first low potential voltage sub line VSSX1 is disposed on one of the plurality of 1b-th plate patterns 121b and one of the plurality of line patterns 122 and each second low potential voltage sub line VSSX2 is disposed on one of the plurality of 1a-th plate patterns 121a. Further, each third low potential voltage sub line VSSX3 is disposed below the corresponding high potential voltage main line VDDY on the one of the plurality of 1a-th plate patterns 121a.

In the meantime, referring to FIG. 3, a bank 147 is formed on the first connection pad CNT1, the second connection pad CNT2, the connection lines 181 and 182, and the planarization layer 146. The bank 147 is a component which separates adjacent sub pixels SPX from each other. The bank 147 is disposed so as to cover at least a part of the first connection pad CNT1, the second connection pad CNT2, the connection lines 181 and 182, and the planarization layer 146. The bank 147 may be formed of an insulating material. Further, the bank 147 may include a black material. The bank 147 includes the black material to block wiring lines which may be visible through the active area AA. For example, the bank 147 may be formed of a transparent carbon-based mixture and specifically, include carbon black. However, it is not limited thereto and the bank 147 may be formed of a transparent insulating material. Even though in FIG. 1, it is illustrated that a height of the bank 147 is lower than a height of the light emitting diode 170, the present disclosure is not limited thereto and the height of the bank 147 may be equal to the height of the light emitting diode 170.

Referring to FIG. 3, the light emitting diode 170 is disposed on the first connection pad CNT1 and the second connection pad CNT2. The light emitting diode 170 includes an n-type layer 171, an active layer 172, a p-type layer 173, an n-electrode 174, and a p-electrode 175. The light emitting diode 170 of the display device 100 according to the example embodiment of the present disclosure has a flip-chip structure in which the n-electrode 174 and the p-electrode 175 are formed on one surface.

The n-type layer 171 may be formed by injecting an n-type impurity into gallium nitride (GaN) having excellent crystallinity. The n-type layer 171 may be disposed on a separate base substrate which is formed of a material which is capable of emitting light.

The active layer 172 is disposed on the n-type layer 171. The active layer 172 is a light emitting layer which emits light in the light emitting diode 170 and may be formed of a nitride semiconductor, for example, indium gallium nitride (InGaN). The p-type layer 173 is disposed on the active layer 172. The p-type layer 173 may be formed by injecting a p-type impurity into gallium nitride (GaN).

As described above, the light emitting diode 170 according to the example embodiment of the present disclosure may be manufactured by sequentially laminating the n-type layer 171, the active layer 172, and the p-type layer 173, and then etching a predetermined or selected part to form the n-electrode 174 and the p-electrode 175. In this case, the predetermined or selected part which is a space for separating the n-electrode 174 and the p-electrode 175 from each other may be etched to expose a part of the n-type layer 171. In other words, the surfaces of the light emitting diode 170 on which the n-electrode 174 and the p-electrode 175 are disposed are not flat surfaces, but have different heights.

As described above, the n-electrode 174 is disposed in the etched area and is formed of a conductive material. The p-electrode 175 is disposed in an area which is not etched and is also formed of a conductive material. For example, the n-electrode 174 is disposed on the n-type layer 171 which is exposed by the etching process and the p-electrode 175 is disposed on the p-type layer 173. The p-electrode 175 may be formed of the same material as the n-electrode 174.

An adhesive layer AD is disposed so as to cover the first connection pad CNT1 and the second connection pad CNT2. The adhesive layer AD is disposed on top surfaces of the first connection pad CNT1 and the second connection pad CNT2 and between the first connection pad CNT1 and the second connection pad CNT2 so that the light emitting diode 170 may be bonded onto the first connection pad CNT1 and the second connection pad CNT2. In this case, the n-electrode 174 may be disposed on the second connection pad CNT2 and the p-electrode 175 may be disposed on the first connection pad CNT1.

The adhesive layer AD may be a conductive adhesive layer in which conductive balls are dispersed in an insulating base member. Therefore, when heat or a pressure is applied to the adhesive layer AD, the conductive balls are electrically connected in a portion applied with the heat or pressure to have a conductive property and an area which is not pressurized may have an insulation property. For example, the n-electrode 174 is electrically connected to the second connection pad CNT2 by means of the adhesive layer AD and the p-electrode 175 is electrically connected to the first connection pad CNT1 by means of the adhesive layer AD. That is, after applying the adhesive layer AD on the top surface of the first connection pad CNT1 and the second connection pad CNT2 using an inkjet method, the light emitting diode 170 is transferred onto the adhesive layer AD and the light emitting diode 170 is pressurized and heated. By doing this, the first connection pad CNT1 is electrically connected to the p-electrode 175 and the second connection pad CNT2 is electrically connected to the n-electrode 174. However, the remaining part of the adhesive layer AD excluding a part of the adhesive layer AD disposed between the n-electrode 174 and the second connection pad CNT2 and a part of the adhesive layer AD disposed between the p-electrode 175 and the first connection pad CNT1 have an insulating property. In the meantime, the adhesive layer AD may include portions disposed on the first connection pad CNT1 and the second connection pad CNT2, respectively.

The first connection pad CNT1 is electrically connected to the drain electrode 164 of the driving transistor 160 to be applied with a driving voltage from the driving transistor 160 to drive the light emitting diode 170. Even though in FIG. 3, it is illustrated that the first connection pad CNT1 is not in direct contact with the drain electrode 164 of the driving transistor 160, but is in indirect contact therewith, the present disclosure is not limited thereto. Therefore, the first connection pad CNT1 and the drain electrode 164 of the driving transistor 160 may be in direct contact with each other. Further, a low potential driving voltage is applied to the second connection pad CNT2 to drive the light emitting diode 170. Therefore, when the display device 100 is turned on, different voltage levels applied to the first connection pad CNT1 and the second connection pad CNT2 are transmitted to the n-electrode 174 and the p-electrode 175 so that the light emitting diode 170 emits light.

The upper substrate 112 is a substrate which supports various components disposed below the upper substrate 112. Specifically, the upper substrate 112 may be formed by coating and curing a material of the upper substrate 112 on the lower substrate 111 and the first plate pattern 121. The upper substrate 112 may be disposed to be in contact with the lower substrate 111, the first plate pattern 121, the first line pattern 122, and the connection lines 181 and 182.

The upper substrate 112 may be formed of the same material as the lower substrate 111. For example, the upper substrate 112 may be formed of a silicon rubber such as polydimethylsiloxane (PDMS) or an elastomer such as polyurethane (PU) or polytetrafluoroethylene (PTFE) and thus have a flexible property. However, the material of the upper substrate 112 is not limited thereto.

Even though not illustrated in FIG. 3, a polarization layer may be disposed on the upper substrate 112. The polarization layer may perform a function which polarizes light incident from the outside of the display device 100 to reduce the external light reflection. Further, an optical film other than the polarization layer may be disposed on the upper substrate 112.

The filling layer 190 is disposed on the entire surface of the lower substrate 111 to be filled between the components disposed on the upper substrate 112 and the lower substrate 111. The filling layer 190 may include a curable adhesive. Specifically, the material of the filling layer 190 is coated on the entire surface of the lower substrate 111 and then is cured so that the filling layer 190 may be disposed between the components disposed on the upper substrate 112 and the lower substrate 111. For example, the filling layer 190 may be an optically clear adhesive (OCA) and may be one or more of an acrylic adhesive, a silicon based adhesive, and an urethane based adhesive.

Figure 5:
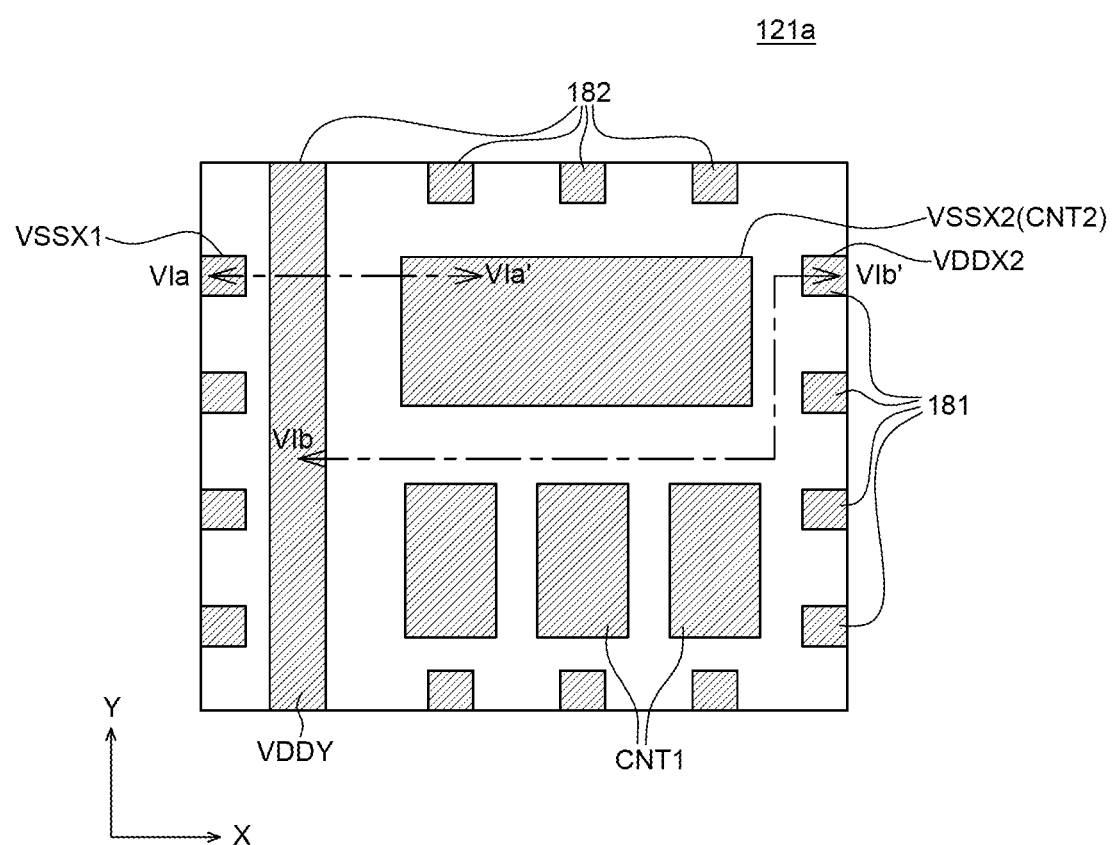
FIG. 5 is a plan view of a first plate pattern of a display device according to an example embodiment of the present disclosure.
Figure 6A:
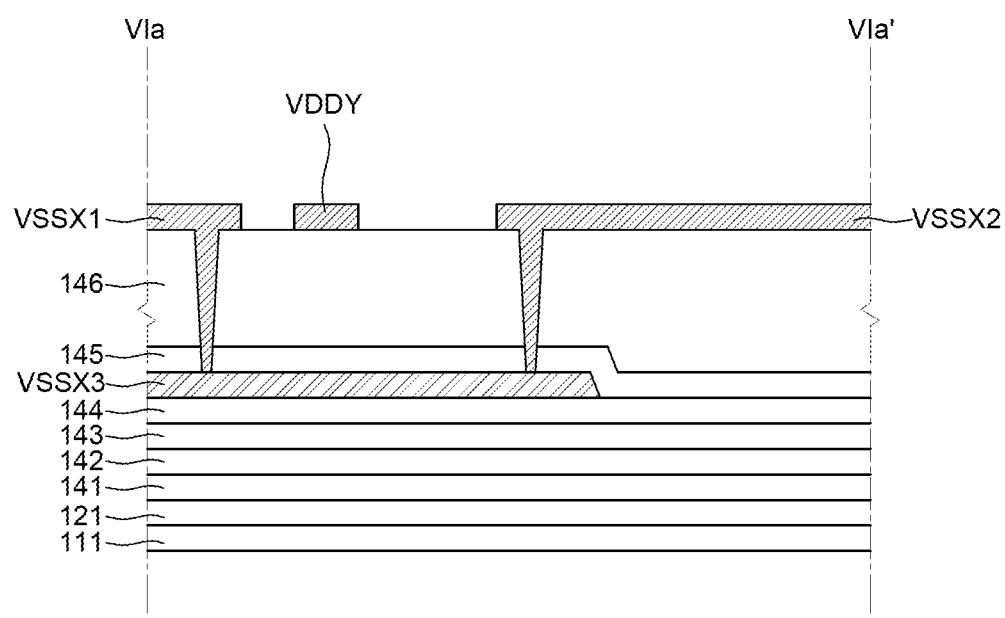
FIG. 6A is a cross-sectional view taken along the line VIa-VIa' of FIG. 5.
Figure 6B:
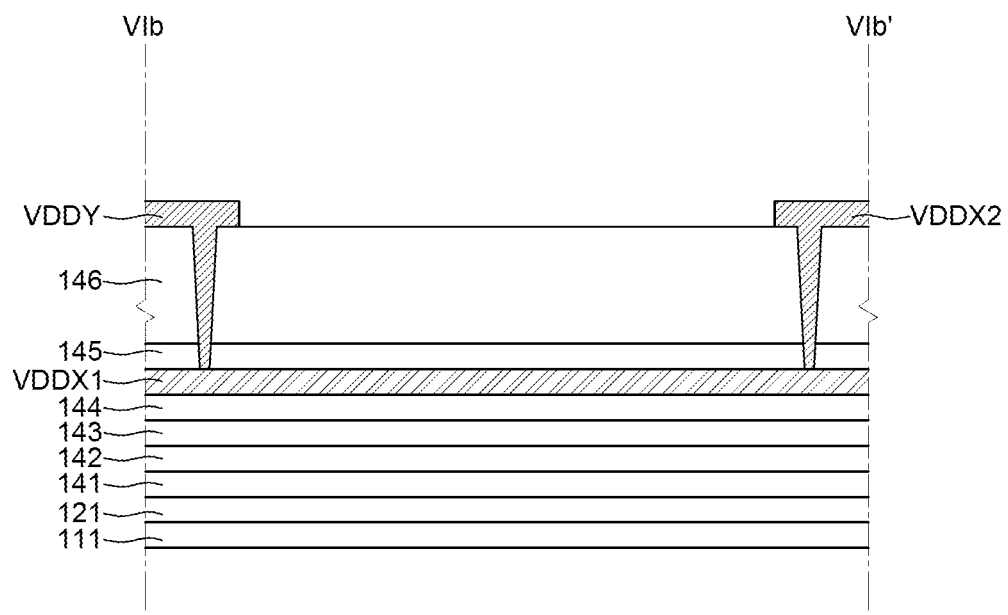
FIG. 6B is a cross-sectional view taken along the line VIb-VIb' of FIG. 5.

Hereinafter, the high potential voltage line VDDL and the low potential voltage line VSSL will be described in more detail with reference to FIGS. 5 to 8 together.
Planar and Cross-Sectional Structures of First Plate Pattern FIG. 5 is a plan view of a 1a-th plate pattern of a display device according to an example embodiment of the present disclosure. FIG. 6A is a cross-sectional view taken along the line VIa-VIa' of FIG. 5. FIG. 6B is a cross-sectional view taken along the line VIb-VIb' of FIG. 5.

Figure 7:
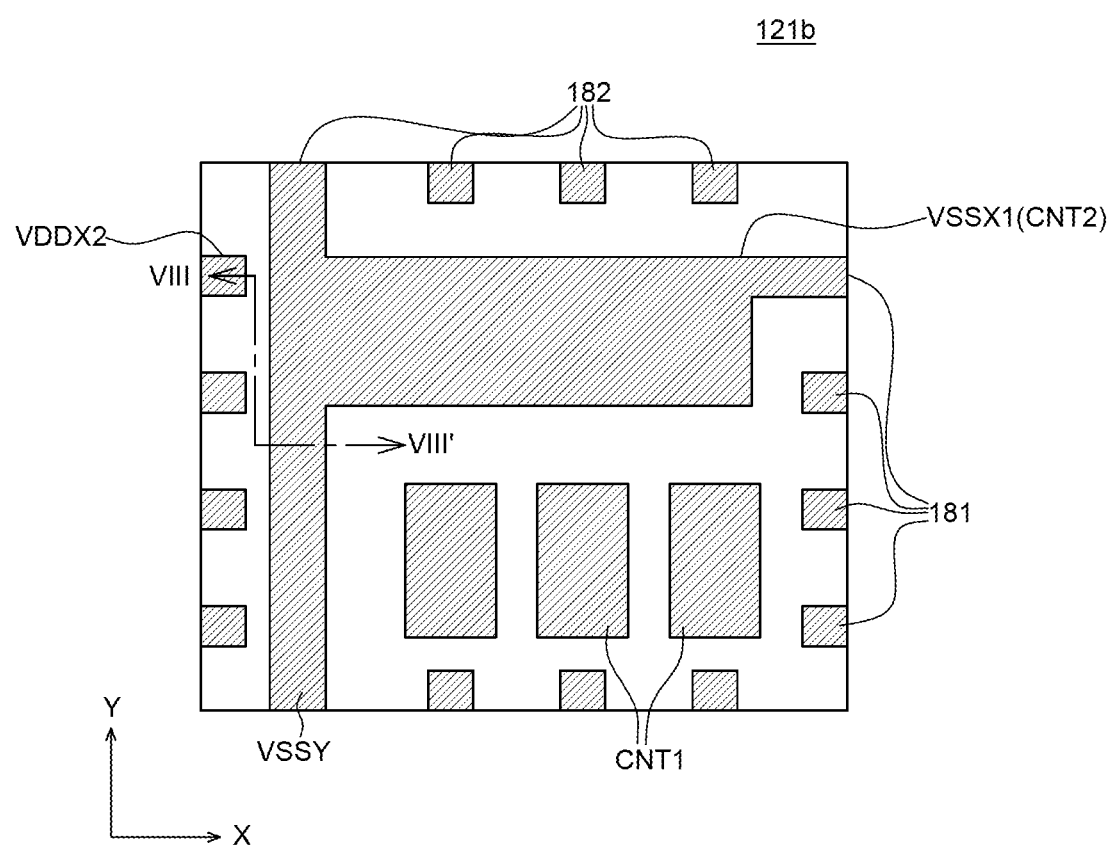
FIG. 7 is a plan view of a 1b-th plate pattern of a display device according to an example embodiment of the present disclosure.
Figure 8:
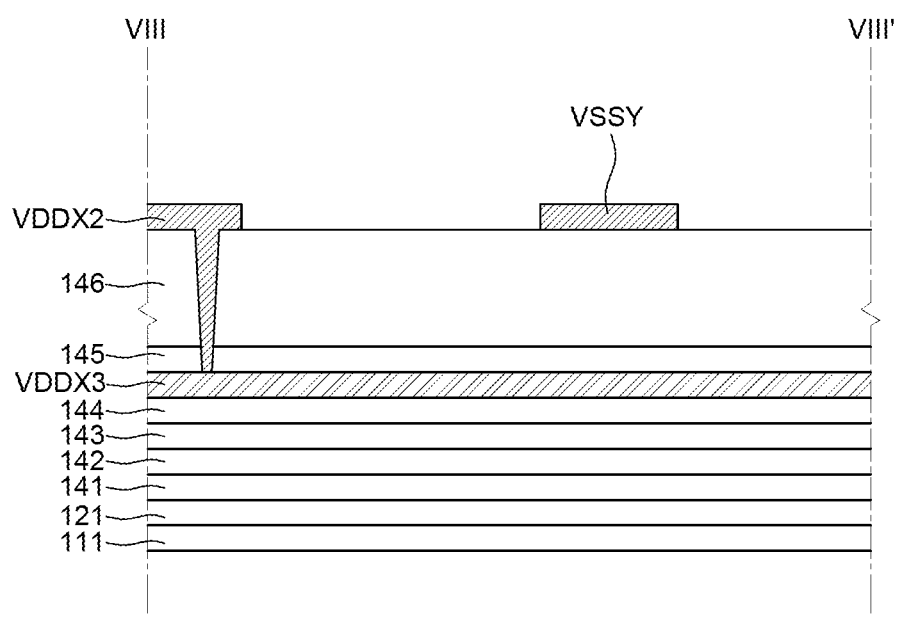
FIG. 8 is a cross-sectional view taken along the line VIII-VIII' of FIG. 7.

FIG. 7 is a plan view of a 1b-th plate pattern of a display device according to an example embodiment of the present disclosure. FIG. 8 is a cross-sectional view taken along the line VIII-VIII' of FIG. 7. FIGS. 5 to 8 schematically illustrate planar and cross-sectional structures of the high potential voltage line VDDL and the low potential voltage line VSSL disposed on the first plate pattern 121. For the convenience of illustration, in FIGS. 5 and 7, only the plurality of connection lines 181 and 182, the first connection pad CNT1, and the second connection pad CNT2 disposed above the planarization layer 146 are illustrated.

Referring to FIG. 5, the plurality of first connection lines 181 disposed on the 1a-th plate pattern 121a is electrically connected to a conductive layer disposed on a lower layer which is different from a layer on which the first connection lines 181 are disposed. Some of the plurality of first connection lines 181 may be a first low potential voltage sub line VSSX1 or a second high potential voltage sub line VDDX2.

The second low potential voltage sub line VSSX2 disposed on the 1a-th plate pattern 121a is a second connection pad CNT2 to transmit the low potential voltage to the plurality of light emitting diodes 170. That is, the low potential voltage may be transmitted to the n-electrode 174 of the light emitting diode 170 through the second connection pad CNT2 which is the second low potential voltage sub line VSSX2. Regardless of the plurality of light emitting diodes 170 disposed on one 1a-th plate pattern 121a, the number of second low potential voltage sub line VSSX2 may be one. For example, when three light emitting diodes 170 are disposed on the 1a-th plate pattern 121a, the second low potential voltage sub line VSSX2 may equally apply a low potential voltage to three light emitting diodes 170.

One of the plurality of second connection lines 182 disposed on the 1a-th plate pattern 121a is a high potential voltage main line VDDY and is disposed above the planarization layer 146. The remaining of the plurality of second connection lines 182 excluding the high potential voltage main line VDDY may be electrically connected to the conductive layer disposed on a lower layer which is different from a layer on which the second connection line 182 is disposed.

Referring to FIGS. 5 and 6A, the first low potential voltage sub line VSSX1 and the second low potential voltage sub line VSSX2 are formed of the same material as the plurality of connection lines 181 and 182. The third low potential voltage sub line VSSX3 is formed of the same material as any one of the gate electrodes 151,161, the source electrode 153, and the drain electrodes 154,164. That is, the third low potential voltage sub line VSSX3 is disposed on the same layer as any one of the gate electrodes 151,161, the source electrode 153, and the drain electrodes 154,164 to be electrically connected to the first low potential voltage sub line VSSX1 and the second low potential voltage sub line VSSX2 through a contact hole. One end of the third low potential voltage sub line VSSX3 is connected to the first low potential voltage sub line VSSX1 through a first contact hole and the other end of the third low potential voltage sub line VSSX3 is connected to the second low potential voltage sub line VSSX2 through a second contact hole.

Referring to FIGS. 5 and 6B together, the first high potential voltage sub line VDDX1 is formed of the same material as any one of the gate electrodes 151,161, the source electrode 153, and the drain electrodes 154,164. The high potential voltage main line VDDY and the second high potential voltage sub line VDDX2 are formed of the same material as the plurality of connection lines 181 and 182. That is, the first high potential voltage sub line VDDX1 is disposed on the same layer as any one of the gate electrodes 151,161, the source electrode 153, and the drain electrodes 154 to be electrically connected to the high potential voltage main line VDDY and the second high potential voltage sub line VDDX2 through a contact hole. For example, one end of the first high potential voltage sub line VDDX1 is connected to the high potential voltage main line VDDY through a third contact hole and the other end of the first high potential voltage sub line VDDX1 is connected to the second high potential voltage sub line VDDX2 through a fourth contact hole.

Referring to FIG. 7, one of the plurality of first connection lines 181 disposed on the 1b-th plate pattern 121b is a first low potential voltage sub line VSSX1 and another one is a second high potential voltage sub line VDDX2 and is disposed above the planarization layer 146. The remaining of the plurality of first connection lines 181 excluding the first low potential voltage sub line VSSX1 may be electrically connected to the conductive layer disposed on a lower layer which is different from a layer on which the second connection line 182 is disposed.

The second connection pad CNT2 which is a first low potential voltage sub line VSSX1 disposed on the 1b-th plate pattern 121b is connected to the first connection line 181 to transmit the low potential voltage to the plurality of light emitting diodes 170. Regardless of the plurality of light emitting diodes 170 disposed on one 1b-th plate pattern 121b, the number of first low potential voltage sub line VSSX1 may be one. For example, when three light emitting diodes 170 are disposed on the 1b-th plate pattern 121b, the first low potential voltage sub line VSSX1 may equally apply the low potential voltage to three light emitting diodes 170.

One of the plurality of second connection lines 182 disposed on the 1b-th plate pattern 121b is a low potential voltage main line VSSY and is disposed above the planarization layer 146. The remaining of the plurality of second connection lines 182 excluding the low potential voltage main line VSSY may be electrically connected to the conductive layer disposed on a lower layer which is different from a layer on which the second connection line 182 is disposed. The low potential voltage main line VSSY and the first low potential voltage sub line VSSX1 are connected to directly intersect each other on the planarization layer 146. For example, the low potential voltage main line VSSY is directly connected to the first low potential voltage sub line VSSX1 on the 1b-th plate pattern 121b. It should be understood that "connected" does not require the presence of a connector. For example, the low potential voltage main line VSSY and the first potential voltage sub line VSSX1 are integrally formed as a continuous layer that may have no visible interface therebetween.

Referring to FIGS. 7 and 8, the third high potential voltage sub line VDDX3 is formed of the same material as any one of the gate electrodes 151, 161, the source electrode 153, and the drain electrodes 154, 164. That is, the third high potential voltage sub line VDDX3 is disposed on the same layer as any one of the gate electrodes 151,161, the source electrode 153, and the drain electrodes 154 to be electrically connected to the second high potential voltage sub line VDDX2 through a contact hole. For example, one end of the third high potential voltage sub line VDDX3 is connected to the second high potential voltage sub line VDDX2 through the contact hole.

Referring to FIGS. 6A and 8 together, the high potential voltage main line VDDY and the third low potential voltage sub line VSSX3 are disposed to overlap each other and the low potential voltage main line VSSY and the third high potential voltage sub line VDDX3 are disposed to overlap each other.

Figure 9:
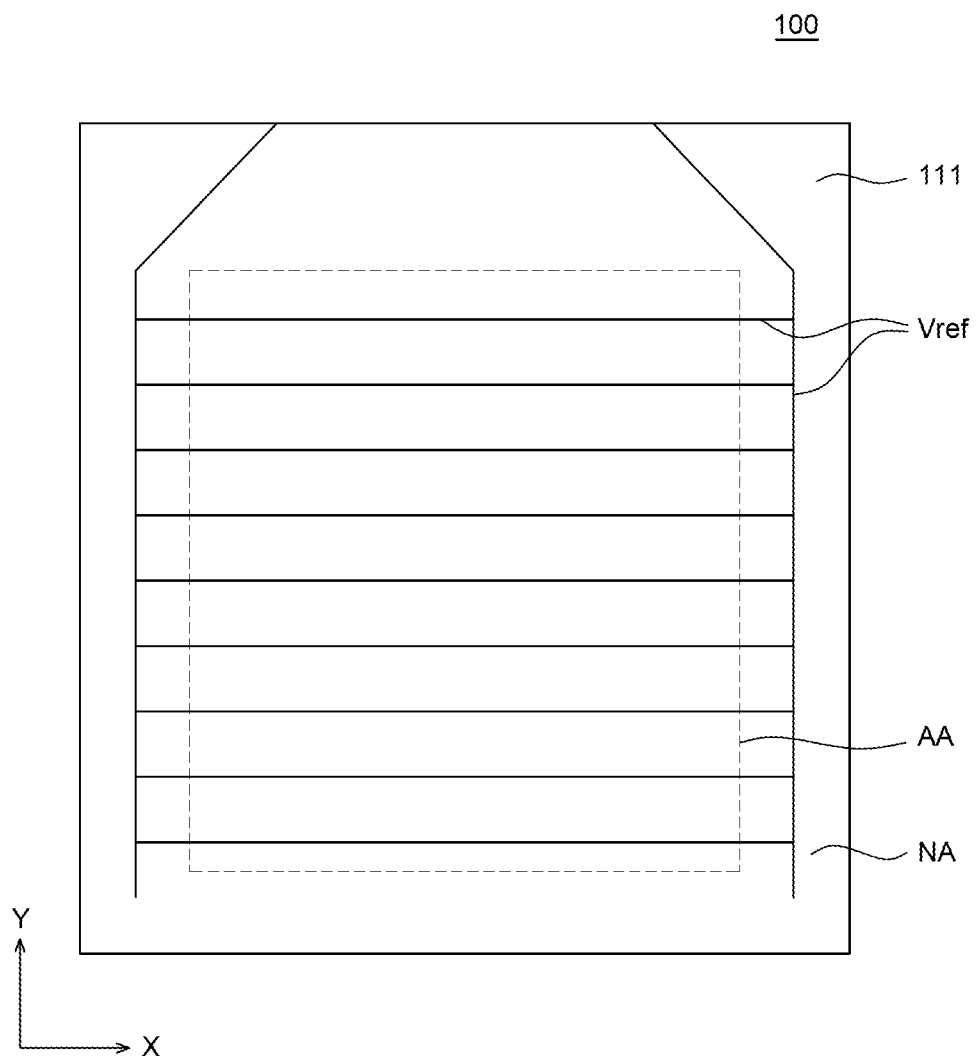
FIG. 9 is a schematic plan view illustrating placement of a reference potential voltage line of a display device according to an example embodiment of the present disclosure.

FIG. 9 is a schematic plan view illustrating placement of a reference potential voltage line of a display device according to an example embodiment of the present disclosure.

Referring to FIG. 9, a plurality of reference potential voltage lines Vref are lines which extend between the plurality of sub pixels SPX in the first direction X to transmit a reference voltage to each of the plurality of sub pixels SPX. The plurality of sub pixels SPX which forms one pixel PX may share one reference potential voltage line Vref. In the non-active area NA, the reference potential voltage line Vref is disposed in the second direction Y which is transverse the first direction X to determine a bezel size.

Generally, the high potential voltage line and the low potential voltage line are disposed in the non-active area as thick lines and apply a high potential voltage and a low potential voltage to the active area by a connection line which intersects therewith to extend. At this time, the high potential voltage connection line does not extend as one line, but is in contact with conductive lines on different layers, rather than the same layer to apply a high potential voltage so that high potential voltage drop due to the contact resistance is caused.

Therefore, in the display device 100 according to the example embodiment of the present disclosure, the power lines VDDL and VSSL are disposed in the first direction X or the second direction Y above the plurality of first plate patterns 121 of the active area AA. Therefore, the contact resistance of the power lines VDDL and VSSL may be reduced. Further, in the non-active area NA, only the reference potential voltage line Vref is disposed, but the power lines VDDL and VSSL are disposed in the active area so that the bezel size is significantly reduced.

Another Example Embodiment of Present Disclosure

Figure 10:
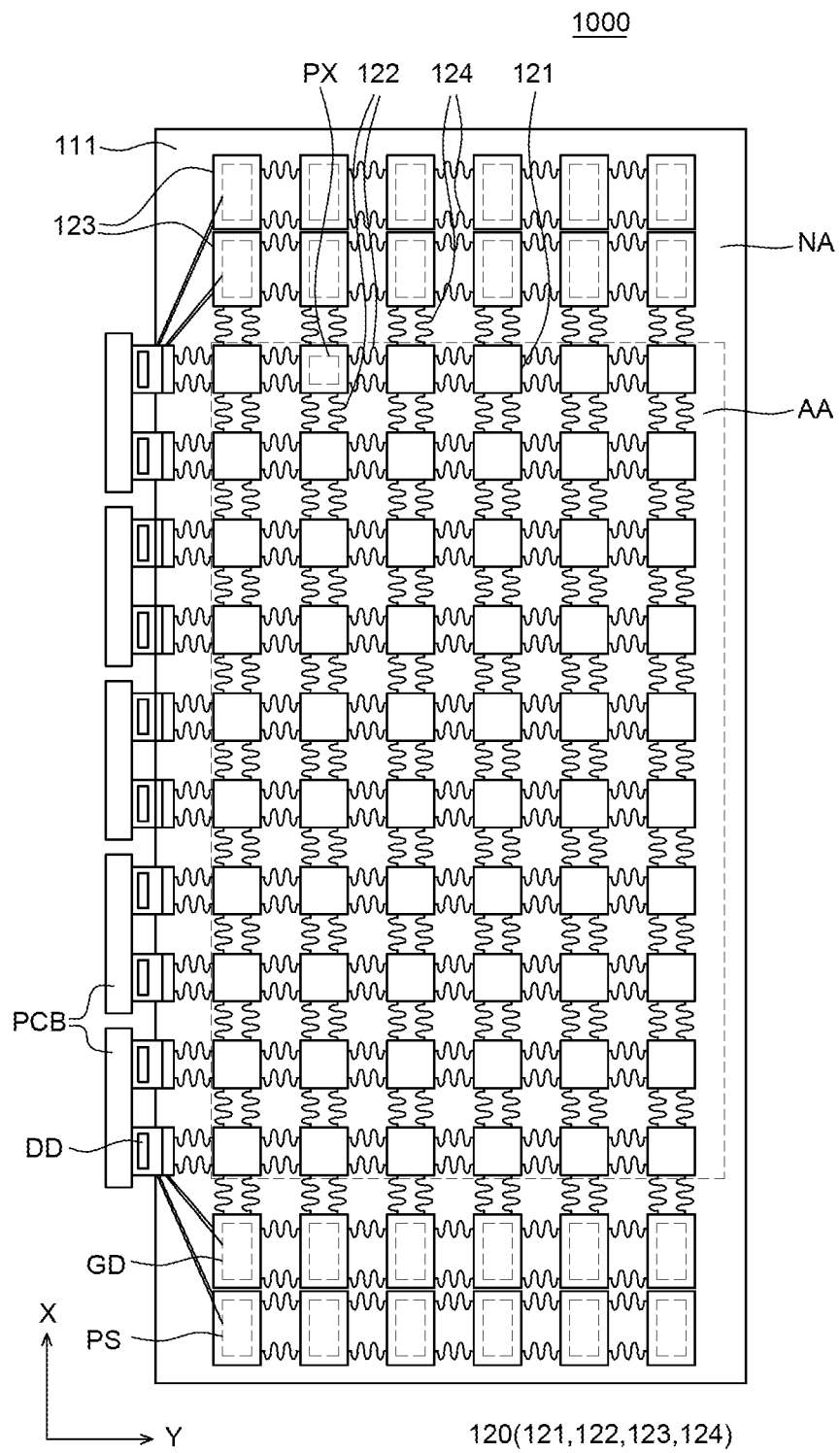
FIG. 10 is a plan view of a display device according to another example embodiment of the present disclosure.

FIG. 10 is a plan view of a display device according to another example embodiment of the present disclosure.

Referring to FIG. 10, a display device 1000 according to another example embodiment of the present disclosure includes a lower substrate 111, a pattern layer 120, a plurality of pixels PX, a gate driver GD, a data driver DD, and a power supply PS. As compared with the display device of FIG. 1, the number of data drivers DD, the number of gate drivers GD, and a placement structure of the plurality of plate patterns 120 are different, but the other configuration is the same so that a redundant description will be omitted.

A display device 1000 according to another example embodiment of the present disclosure is a display device 1000 with a landscape structure. That is, the plurality of data drivers DD is disposed in the first direction X and the plurality of gate drivers GD is disposed in the second direction Y transverse the first direction X. Further, the number of data drivers DD is larger than the number of gate drivers GD. The number of the plurality of first plate patterns 121 disposed on the same row in the first direction X may be smaller than the number of the plurality of first plate patterns 121 disposed on the same column in the second direction Y and the number of data lines may be larger than the number of gate lines.

Generally, in the landscape structure in which the number of data drivers is larger than the number of gate drivers, when the power line is disposed in the non-active area, drops of the high potential voltage and the low potential voltage to be applied to the data driver are caused so that defective yield may be increased.

Therefore, in the display device 1000 according to another example embodiment of the present disclosure, the power lines VDDL and VSSL are disposed in the active area AA to overlap in the first direction X and the second direction Y to apply sufficient high potential voltage and low potential voltage to the data driver DD. Accordingly, in the landscape structure, the defective yield of the data driver DD due to the overlap of the power lines VDDL and VSSL may be significantly reduced while reducing the data delay.

Further, according to the related art, in the landscape structure, the number of data lines is increased so that in order to apply the high potential voltage and the low potential voltage to each of the plurality of data lines, the thick high potential power line and low potential power line need to be disposed in the non-active area. Accordingly, according to the related art, it is difficult to reduce the bezel size.

In contrast, in the display device 1000 according to another example embodiment of the present disclosure, even in the landscape structure, the power lines VDDL and VSSL are disposed in the active area AA to overlap so that a display device with a reduced bezel size may be implemented.

The example embodiments of the present disclosure can also be described as follows:

According to an aspect of the present disclosure, there is provided a display device. The display device includes a stretchable lower substrate which includes an active area and a non-active area disposed at the outside of the active area, a pattern layer which is disposed on the lower substrate and includes a plurality of plate patterns and a plurality of line patterns, a plurality of pixels which is disposed above each of the plurality of plate patterns in the active area, and a plurality of connection lines which is disposed above the plurality of line patterns to connect the plurality of pixels. The plurality of connection lines includes a high potential voltage line and a low potential voltage line which overlap each other in each of the plurality of plate patterns.

The high potential voltage line may include a high potential voltage main line extending in a second direction and a high potential voltage sub line which is electrically connected to the high potential voltage main line and extends in a first direction transverse the second direction and the low potential voltage line may include a low potential voltage main line extending in the second direction and a low potential voltage sub line which is electrically connected to the low potential voltage main line and extends in the first direction.

The plurality of plate patterns may include a plurality of 1a-th plate patterns and a plurality of 1b-th plate patterns which is alternately disposed with the plurality of 1a-th plate patterns in the first direction, the high potential voltage main line may be disposed on the plurality of 1a-th plate patterns, and the low potential voltage main line may be disposed on the plurality of 1b-th plate patterns.

The high potential voltage sub line may be electrically connected to the high potential voltage main line disposed on the plurality of 1a-th plate patterns and extend to the plurality of 1b-th plate patterns adjacent to the plurality of 1a-th plate patterns.

The high potential voltage sub line may include a first high potential voltage sub line disposed below the high potential voltage main line on the plurality of 1a-th plate patterns, a second high potential voltage sub line disposed on the plurality of line patterns, and a third high potential voltage sub line disposed below the low potential voltage main line on the plurality of 1b-th plate patterns.

The low potential voltage main line and the third high potential voltage sub line may be disposed to overlap each other.

The display device according may further include a transistor including a gate electrode, an active layer, a source electrode, and a drain electrode disposed on the plurality of plate patterns. The first high potential voltage sub line and the third high potential voltage sub line may be formed of the same material as any one of the gate electrode, the source electrode, and the drain electrode of the transistor and the second high potential voltage sub line may be formed of the same material as the plurality of connection lines.

The low potential voltage sub line may be electrically connected to the low potential voltage main line disposed on the plurality of 1b-th plate patterns and extend to the plurality of 1a-th plate patterns adjacent to the plurality of 1b-th plate patterns.

The low potential voltage sub line may include a first low potential voltage sub line disposed on the plurality of 1b-th plate patterns and the plurality of line patterns, a second low potential voltage sub line disposed on the plurality of 1a-th plate patterns, and a third low potential voltage sub line disposed below the high potential voltage main line on the plurality of 1a-th plate patterns.

The high potential voltage main line and the third low potential voltage sub line may be disposed to overlap each other.

The display device may further include a transistor including a gate electrode, an active layer, a source electrode, and a drain electrode disposed on the plurality of plate patterns. The first low potential voltage sub line may be formed of the same material as the plurality of connection lines, and the third low potential voltage sub line may be formed of the same material as any one of the gate electrode, the source electrode, and the drain electrode of the transistor.

A connection lines extending in the second direction, among the plurality of connection lines, may include at least one of the high potential voltage main line, the low potential voltage main line, and a plurality of data lines.

A connection line extending in the first direction, among the plurality of connection lines, may include at least one of a scan line, an emission signal line, and an initialization voltage line.

In the non-active area, a plurality of data drivers disposed in a first direction and a plurality of gate drivers disposed in a second direction overlap the first direction may be disposed and the number of data drivers may be larger than the number of gate drivers.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
    a stretchable lower substrate which includes an active area and a non-active area disposed outside of the active area;
    a pattern layer which is disposed on the lower substrate and includes a plurality of plate patterns and a plurality of line patterns;
    a plurality of pixels which is disposed above the plurality of plate patterns in the active area; and
    a plurality of connection lines which is disposed above the plurality of line patterns and connects the plurality of pixels to each other,
    wherein the plurality of connection lines includes respective high potential voltage lines and respective low potential voltage lines which overlap each other on each of the plurality of plate patterns,
    wherein:
    the high potential voltage line includes:
        a high potential voltage main line extending in a second direction, and
        a high potential voltage sub line which is electrically connected to the high potential voltage main line and extends in a first direction transverse the second direction; and
    the low potential voltage line includes:
        a low potential voltage main line extending in the second direction, and
        a low potential voltage sub line which is electrically connected to the low potential voltage main line and extends in the first direction.

2. The display device according to claim 1, wherein:
    the plurality of plate patterns includes:
        a plurality of 1a-th plate patterns, and
        a plurality of 1b-th plate patterns which is alternately disposed with the plurality of 1a-th plate patterns in the first direction;
    the high potential voltage main line is disposed on the plurality of 1a-th plate patterns; and
    the low potential voltage main line is disposed on the plurality of 1b-th plate patterns.

3. The display device according to claim 2, wherein the high potential voltage sub line is electrically connected to the high potential voltage main line disposed on the plurality of 1a-th plate patterns and extends to the plurality of 1b-th plate patterns adjacent to the plurality of 1a-th plate patterns.

4. The display device according to claim 3, wherein the high potential voltage sub line includes:
    a first high potential voltage sub line disposed below the high potential voltage main line on at least one of the plurality of 1a-th plate patterns;
    a second high potential voltage sub line disposed on at least one of the plurality of line patterns; and
    a third high potential voltage sub line disposed below the low potential voltage main line on at least one of the plurality of 1b-th plate patterns.

5. The display device according to claim 4, wherein the low potential voltage main line and the third high potential voltage sub line are disposed to overlap each other.

6. The display device according to claim 4, further comprising:

a transistor including a gate electrode, an active layer, a source electrode, and a drain electrode disposed on at least one of the plurality of plate patterns, wherein the first high potential voltage sub line and the third high potential voltage sub line are formed of the same material as any one of the gate electrode, the source electrode, and the drain electrode of the transistor; and wherein the second high potential voltage sub line is formed of the same material as the plurality of connection lines.

7. The display device according to claim 2, wherein the low potential voltage sub line is electrically connected to the low potential voltage main line disposed on the plurality of 1b-th plate patterns and extends to the plurality of 1a-th plate patterns adjacent to the plurality of 1b-th plate patterns.

8. The display device according to claim 7, wherein the low potential voltage sub line includes:
a first low potential voltage sub line disposed on at least one of the plurality of 1b-th plate patterns and one of the plurality of line patterns;
a second low potential voltage sub line disposed on at least one of the plurality of 1a-th plate patterns; and
a third low potential voltage sub line disposed below the high potential voltage main line on the at least one of the plurality of 1a-th plate patterns.

9. The display device according to claim 8, wherein the high potential voltage main line and the third low potential voltage sub line are disposed to overlap each other.

10. The display device according to claim 8, further comprising:
a transistor including a gate electrode, an active layer, a source electrode, and a drain electrode disposed on one of the plurality of plate patterns,
wherein the first low potential voltage sub line is formed of the same material as the plurality of connection lines; and
wherein the third low potential voltage sub line is formed of the same material as any one of the gate electrode, the source electrode, and the drain electrode of the transistor.

11. The display device according to claim 1, wherein connection lines extending in the second direction, among the plurality of connection lines, include at least one of the high potential voltage main line, the low potential voltage main line, and a plurality of data lines.

12. The display device according to claim 1, wherein a connection line extending in the first direction, among the plurality of connection lines, includes at least one of a scan line, an emission signal line, and an initialization voltage line.

13. The display device according to claim 1, wherein in the non-active area, a plurality of data drivers are disposed in a first direction and a plurality of gate drivers are disposed in a second direction transverse the first direction, and the number of data drivers is larger than the number of gate drivers.

14. A display device, comprising:
a substrate;
a pattern layer on the substrate, the pattern layer including:
a first plate pattern,
a second plate pattern adjacent the first plate pattern, and
a line pattern that connects the first plate pattern to the second plate pattern;
a first pixel on the first plate pattern;
a second pixel on the second plate pattern;
a low potential voltage line that overlaps the second plate pattern; and
a high potential voltage line that overlaps the first plate pattern and the second plate pattern, the high potential voltage line overlapping the low potential voltage line over the second plate pattern,
wherein:
the high potential voltage line includes:
a high potential voltage main line that extends in a second direction, and
a high potential voltage sub line electrically connected to the high potential voltage main line and that extends in a first direction transverse the second direction; and
the low potential voltage line includes:
a low potential voltage main line that extends in the second direction, and
a low potential voltage sub line electrically connected to the low potential voltage main line and that extends in the first direction.

15. The display device of claim 14, wherein the high potential voltage sub line includes:
a first high potential voltage sub line disposed below the high potential voltage main line on the first plate pattern;
a second high potential voltage sub line disposed on the line pattern; and
a third high potential voltage sub line disposed below the low potential voltage main line on the second plate pattern.

16. The display device of claim 15, further comprising:
a third plate pattern adjacent the second plate pattern,
wherein the low potential voltage sub line includes:
a first low potential voltage sub line disposed on the second plate pattern and on a second line pattern that connects the second plate pattern to the third plate pattern;
a second low potential voltage sub line disposed on the third plate pattern; and
a third low potential voltage sub line disposed below a second high potential voltage main line on the third plate pattern.

17. The display device of claim 16, further comprising:
a transistor including a gate electrode, an active layer, a source electrode, and a drain electrode disposed on one of the plurality of plate patterns,
wherein the first high potential voltage sub line and the third high potential voltage sub line are formed of the same material as any one of the gate electrode, the source electrode, and the drain electrode of the transistor.

18. The display device of claim 16, further comprising:
a transistor including a gate electrode, an active layer, a source electrode, and a drain electrode disposed on the second plate pattern,
wherein the third low potential voltage sub line is formed of the same material as any one of the gate electrode, the source electrode, and the drain electrode of the transistor.

* * * * *